(12) United States Patent
Akhter et al.

(10) Patent No.: US 11,961,558 B2
(45) Date of Patent: Apr. 16, 2024

(54) HIDDEN WRITES IN A RESISTIVE MEMORY

(71) Applicant: NXP USA, Inc., Austin, TX (US)

(72) Inventors: Tahmina Akhter, Lakeway, TX (US); Gilles Joseph Maurice Muller, Austin, TX (US)

(73) Assignee: NXP USA, Inc., Austin, TX (US)

( * ) Notice: Subject to any disclaimer, the term of this patent is extended or adjusted under 35 U.S.C. 154(b) by 220 days.

(21) Appl. No.: 17/447,746

(22) Filed: Sep. 15, 2021

(65) Prior Publication Data

US 2023/0083511 A1 Mar. 16, 2023

(51) Int. Cl.
*G11C 13/00* (2006.01)
(52) U.S. Cl.
CPC ........ *G11C 13/0069* (2013.01); *G11C 13/003* (2013.01); *G11C 13/0038* (2013.01); *G11C 13/0026* (2013.01)

(58) Field of Classification Search
None
See application file for complete search history.

(56) References Cited

U.S. PATENT DOCUMENTS

| | | | | |
|---|---|---|---|---|
| 6,507,913 B1 * | 1/2003 | Shamir | ................ | G06K 19/073 713/300 |
| 9,478,287 B2 | 10/2016 | Chou et al. | | |
| 9,837,154 B2 | 12/2017 | Buchanan | | |
| 10,163,505 B2 | 12/2018 | Lee et al. | | |
| 2002/0051381 A1 * | 5/2002 | Numata | ................... | G11C 11/15 365/158 |
| 2006/0013039 A1 * | 1/2006 | Braun | ..................... | G11C 11/15 365/171 |
| 2011/0222355 A1 * | 9/2011 | Nakashima | ......... | G11C 11/1673 327/315 |
| 2013/0250657 A1 | 9/2013 | Haukness et al. | | |
| 2017/0177374 A1 * | 6/2017 | Morning-Smith | ...... | G06F 1/263 |
| 2019/0371399 A1 | 12/2019 | Haukness et al. | | |
| 2019/0392898 A1 | 12/2019 | Haukness et al. | | |

OTHER PUBLICATIONS

Nagarajan et al.: "SecNVM: Power Side-Channel Elimination Using On-Chip Capacitors for Highly Secure Emerging NVM," IEEE Transactions on Very Large Scale Integration (VLSI) Systems, vol. 29, Issue: 8, Aug. 2021, DOI: 10.1109/TVLSI.2021.3087734, pp. 1518-1528.

(Continued)

*Primary Examiner* — J. H. Hur

(57) ABSTRACT

An integrated circuit (IC) device includes a non-volatile memory device with an array of non-volatile memory cells, and an isolation circuit configured to conduct voltage from an internal voltage supply to one of the memory cells during a hidden write operation to the one of the memory cells, and conduct voltage from an external voltage supply to the one of the memory cells during a non-hidden write operation to the one of the memory cells. Current at the external voltage supply can be monitored external to the IC device during the non-hidden write operation, and current of the internal voltage supply is provided by a capacitor that cannot be monitored external to the IC device during the hidden write operation.

13 Claims, 8 Drawing Sheets

(56) References Cited

OTHER PUBLICATIONS

Chou, et al.: "An N40 256K×44 Embedded RRAM Macro with SL-Precharge SA and Low-Voltage Current Limiter to Improve Read and Write Performance," ISSCC 2018 / SESSION 30 / Emerging Memories / 30.1, 2018 IEEE International Solid-State Circuits Conference, TSMC, Hsinchu, Taiwan, Digest of Technical Papers, ISSCC 2018 / Feb. 14, 2018 / 1:30 PM, pp. 478-479.
U.S. Appl. No. 16/845,315, Sanjeevarao, Padmaraj, "Non-Volatile Memory With Multiplexer Transistor Regulator Circuit", filed Apr. 10, 2020.
U.S. Appl. No. 17/032,516, Ramanan, Karthik, "Non-Volatile Memory Having Virtual Ground Circuitry", filed Sep. 25, 2020.

* cited by examiner

HIDDEN WRITES IN A RESISTIVE MEMORY

BACKGROUND OF THE INVENTION

Field of the Invention

This invention relates to resistive memories, and more specifically, to hidden writes in a resistive memory.

Background

Non-volatile memories (NVMs) are utilized for storing data in an electronic system including when the system is powered down. One type of non-volatile memory is a resistive memory, in which each bit cell of a resistive memory includes a resistive storage element which is in either a high resistive state (HRS) or a low resistive state (LRS), depending on the logic state of the bit cell. In some embodiments, for a write operation of a bit cell of a resistive memory, a write current is provided in a first direction through the resistive storage element to place it in the HRS, and a write current is provided in a second and opposite direction through the resistive storage element to place it in the LRS. However, since a typical write in a resistive memory requires a current of over 300 microamps (and typically with a write pulse duration of 100-200 nanoseconds), the write event may be detectable with a side channel attack. Therefore, a need exists for an NVM memory, such as a resistive memory, capable of hidden writes in which a write operation cannot be detected with a side-channel attack.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

In many security applications, it is necessary to be able to write to an NVM location without detection with a side-channel attack, in which a side-channel attack may include monitoring the voltage supply on an externally visible (i.e. externally accessible) input/output (I/O) pad of a chip to observe a current profile and possibly determine if a memory write is being performed. For example, normal writes to a resistive memory typically require a large enough write current which result in detectable changes at the voltage supply pad, thus making the memory or chip vulnerable to a side-channel attack. Therefore, in one aspect, hidden writes are performed to memory cells of the resistive memory in which an internally generated voltage is used which does not result in any externally visible changes on the voltage supply pads. In this manner, the write is "hidden" since it cannot be detected for a side-channel attack. These types of hidden writes may be performed to flag and log different security events, such as occurrence of an attack or to indicate an issue. In one embodiment, each event has a corresponding bit location in the NVM which is set to a logic level one in response to occurrence of the event.

In one embodiment, to perform a hidden write to a resistive memory cell of a memory, a pre-charged capacitor, pre-charged before the hidden write, is used to supply an internal voltage, VC, which is used to generate the write current during the hidden write. The pre-charged capacitor can be precharged to VC using an external voltage supply (VDIO) provided from an I/O pad, however, while performing the hidden write, the pre-charged capacitor is isolated from VDIO. In this manner, a current profile of the hidden write is not observable at any of the I/O pads, and the memory may therefore be protected from a side-channel attack. Also, since the pre-charged capacitor is used as the internal voltage supply, a voltage control source follower circuit may be used to provide a stable bit line voltage during the hidden write operation despite the internal supply voltage from the pre-charged capacitor quickly ramping down.

Figure 1:
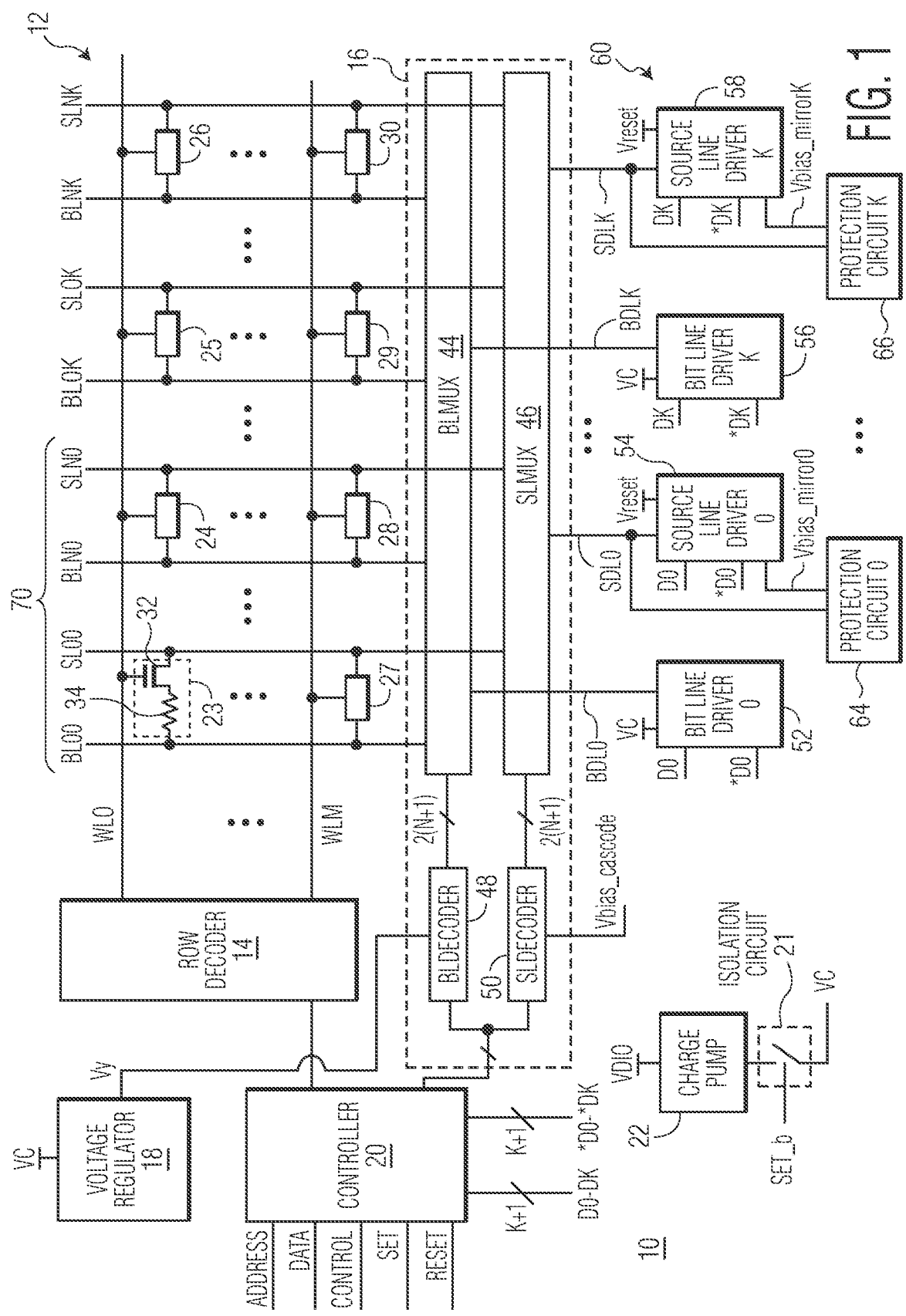
FIG. 1 is a circuit diagram of a non-volatile memory circuit according to one embodiment of the present invention.

FIG. 1 shows a circuit diagram of a non-volatile memory circuit 10 implemented in an integrated circuit, such as a part of a system on a chip (SoC), according to one embodiment of the present invention. Memory circuit 10 includes an array 12 of non-volatile memory cells (e.g. 23-30), a controller 20, a row decoder 14, column decoder 16, voltage regulator 18, a charge pump 22, an isolation circuit 21, and write circuitry 60. In one embodiment, the memory cells of array 12 are characterized as resistive memory cells with a select transistor (e.g. 32) and a resistive storage element (e.g. 34). Types of resistive memory cells include, for example, MRAM, ReRAM, carbon nanotube, and phase change memory cells. In some embodiments, these resistive memory cells may be implemented by a magnetic tunnel junction (MTJ), therefore, each bit cell may be described as including a select transistor (e.g. 32) and an MTJ (e.g. 34). Note that in the illustrated embodiments, the select gate transistors are N-type metal-oxide-semiconductor (NMOS) transistors. However, other types of resistive memory cells may have other configurations or may be implemented with other types of resistive storage structures.

In some embodiments, memory circuit 10 may be coupled to a processor circuit (not shown) of an electronic system that provides data to be written in the memory at a corresponding access address and receives read data from the memory stored at a corresponding access address. Therefore, with each normal write request or read request, a corresponding access address can be provided to controller 20 of memory 10 (as ADDRESS), along with corresponding write data (as DATA), if necessary, and corresponding control signals (as CONTROL, such as a read/write (R/W) indicator). In one embodiment, requests for hidden writes can be provided to controller 20, such as with a SET command. These requests are also provided with a corresponding access address, which addresses one or more bits of memory 10 to be written, in which a SET command refers to a write operation of a logic level one to the addressed one or more bits. A RESET command can also be provided to controller 20, along with a corresponding access address, in which a RESET command refers to a write operation of a logic level zero to the addressed one or more bits. In one embodiment, the RESET command can be performed as a normal write operation. Alternatively, the RESET command can also be performed as a hidden write similar to the SET command. Operation of normal writes and hidden writes will be described in more detail below.

Memory 10 is also coupled to supply voltage terminals coupled to receive corresponding supply voltages, such as VDIO and VSS, in which VDIO is greater than VSS. In one embodiment, VSS is true ground or 0V. Note that as used herein, VDIO and VSS may also refer to the voltage supply terminals which receive the corresponding supply voltages. In the illustrated embodiment, VDIO is an external supply voltage received at an input/output (I/O) pad of the SoC containing memory 10. For example, this I/O pad can be coupled to a battery source and is therefore externally accessible from outside the SoC and outside of memory 10.

Memory 10 also generates an internal supply voltage, VC, in which VC is not externally accessible from outside the SoC or outside of memory 10. Note that, as used herein, VC may also refer to the internal voltage supply terminal (or node) which supplies this internal supply voltage. Memory 10 also includes a charge pump 22 coupled to VDIO, and an isolation circuit 21 (which may be implemented as a switch) between charge pump 22 and VC. In alternate embodiments, charge pump may not be present or may simply be a current limiter if VDIO is sufficiently high. The switch of isolation circuit 21 can be implemented with any type of switching circuitry which is responsive to a control signal to close or open the switch (i.e. to make the switch conductive or non-conductive, respectively). This switch is controlled by a write type indicator such that it is open or non-conductive for a hidden write, but closed or conductive for a normal (non-hidden) write. In the illustrated embodiment, the switch of Isolation circuit 21 is controlled by a control signal SET_b, which may be generated in response to a SET command. For example, upon receiving a SET command, a control signal SET is asserted to a logic level high (and the complement of SET, SET_b, is negated to a logic level low). While performing a SET command (i.e. a hidden write), SET_b is low such that the switch of isolation circuit 21 is open, thus isolating VC from VDIO, and when not performing a SET command (such as for normal writes), SET_b is high and the switch is closed, thus not isolating VC from VDIO. Therefore, one difference between hidden writes and normal writes is the use of isolation circuit 21 to either isolate VC from VDIO or not. Note that in alternate embodiments, any control signal indicating a hidden write can be used as the write type indicator to control isolation circuit 21 accordingly. Also, in the case of normal writes, VC can be supplied as a regulated bit line/source line voltage supply generated from a charge pump (such as charge pump 22) or an external power supply.

Still referring to FIG. 1, the memory cells of array 12 are arranged in rows and columns. Each cell of a row is coupled to a corresponding word line of WL0-WLM for controlling the select transistor (e.g. 32) of the cell to access the resistive storage element (e.g. 34) of the cell during a memory operation. The word lines are controlled by a row decoder 14 which asserts a selected one of the word lines based on a first portion of an address received by a controller 20 of memory circuit 10 for the memory operation. Array 12 includes M+1 number of rows (in which M is an integer greater than or equal to zero) with two rows being shown in FIG. 1. However, an array may include a different number of rows in other embodiments.

In the embodiment shown, the cells of each column of array 12 are coupled to a corresponding source line of SL00-SLNK and a corresponding bit line of BL00-BLNK. Array 12 includes (N+1)*(K+1) source lines and (N+1)*(K+1) bit lines, in which FIG. 1 illustrates four source lines (e.g. SL00, SLN0, SL0K, and SLNK) and four bit lines (e.g. BL00, BLN0, BL0K, and BLNK). Array 12 has K+1 columns, in which K can be any integer greater than or equal to one. Each columns of array 12 includes a bit line paired with a source line. In other embodiments, each column of an array may include a source line paired with two bit lines, a single bit line, or different combinations of bit lines and source lines. In some embodiments, a source line can be shared between two adjacent bit cells. As described herein, a "column line" may refer to either a source line or a bit line.

In the embodiment shown, memory circuit 10 includes a column decoder 16 for selecting a subset of the bit lines and source lines (SL00-SLNK, BL00-BLNK) to provide as bit data lines (BDL0-BDLK) and source data lines (SDL0-SDLK). In the illustrated embodiment, both the bit data lines and the source data lines are provided to write circuitry 60 which includes bit line drivers and source line drivers, along with corresponding protection circuits, as will be described in more detail below. Although not illustrated, memory 10 may also include read circuitry, in which the bit data lines or the source data lines, or both, may be provided to the read circuitry for use during a read operation. Note that each bit line/source line pair (e.g. BDL0/SDL0) corresponds to one column which corresponds to one input/output (I/O) port of memory 10. Therefore, array 12 includes K+1 I/O ports. If array 12 were to only include portion 70, though, memory 10 would have only a single I/O port, i.e. BDL0/SDL0.

Column decoder 16 includes a bit line multiplexer (BL-MUX) 44 for connecting the selected subset of the bit lines to the bit data lines (BLD0-BLDK) and a source line multiplexer (SLMUX) 46 for connecting the selected subset of the source lines to the source data lines (SLD0-SLDK) during a memory operation. Therefore, column decoder 16 selects K+1 number of selected bit lines and selected source lines from a total number of (K+1)*(N+1) bit lines and source lines of array 12 based on the second portion of the ADDRESS received by controller 20 for the memory operation. In some embodiments, K+1 represents the size of the data unit (e.g. 8, 16, 32, 64 bits) being written to or read from memory array 12 during a memory operation. N+1 represents the decode ratio (e.g. 4 to 1, 8 to 1, 16 to 1, 32 to 1) of column decoder 16, in which each of K or N can be any integer greater than or equal to 0. That is, referring to array 12, bit lines BL00-BLNK includes K+1 columns of N+1 bit lines each, such that the first number of the index refers to one of the N+1 bit lines within a particular column of the K+1 columns, and the second number of the index refers to one of the K+1 columns. For example, BL30 refers to bit line 3 in column 0, and BLNK refers to bit line N in column K. The same arrangement and nomenclature apply for source lines SL00-SLNK. As mentioned above, though, in a smaller array, such as one which only includes portion 70 for a single I/O port, there would only be a single column of N+1 bit lines and corresponding source lines, in which column decoder 16 would select only one of the N+1 bit lines and corresponding source lines, corresponding to selecting only one memory cell at the intersection of the selected word line and the selected bit line.

Still referring to FIG. 1, column decoder 16 includes a bit line decoder 48 for selecting the subset of the bit lines (BL00-BLNK) and a source line decoder 50 for selecting the subset of the source lines (SL00-SLNK) during a memory operation. Bit line decoder 48 provides 2(N+1) signals to BLMUX 44 (including bit line select signals BLSel0-BLSelN and complementary bit line select signals *BLSel0-*BLSelN). Source line decoder 50 provides 2(N+1) signals to SLMUX 46 (including source line select signals SLSel0-SLSelN, and complementary source line select signals *SLSel0-*SLSelN). The select signals provided by decoders 48 and 50 are based on a second portion of the ADDRESS received by controller 20 and provided to decoders 48 and 50.

During a normal (non-hidden) write operation to memory 10, the switch of isolation circuit 21 stays closed, and the selected source lines and the selected bit lines are coupled to write circuitry 60, which also receives write data via the data lines (D0-DK) and complementary data lines (*D0-*DK). Write circuitry 60 includes bit line driver circuits (bit line driver 0 52-bit line driver K 56) and source line driver circuits (source line driver 0 54-source line driver K 58). During a normal write operation, each of the bit line drivers and the source line drivers receive the corresponding write data (of D0-DK) to be stored in a selected row of array 12. In one embodiment, during a normal write operation to a bit cell of a column, a corresponding bit line driver couples the bit line (e.g. BL00) of the column to one write voltage of either VDIO or VSS and a corresponding source line driver couples the source line (e.g. SL00) of the column to the other write voltage of VDIO or VSS, depending on the corresponding data value being written. The direction of the resulting write current through the resistive storage element determines the value which is written (i.e. the stored logic state).

Figure 2:
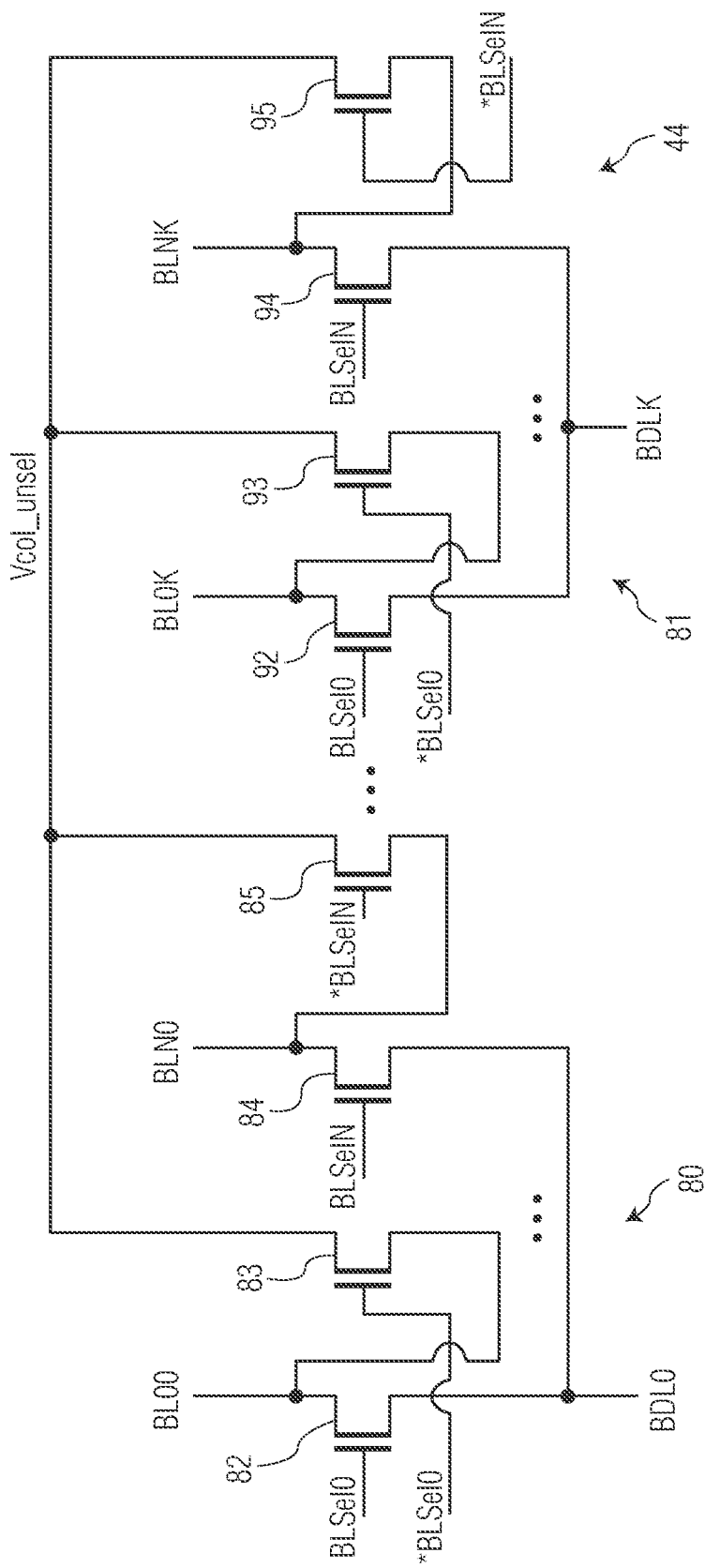
FIG. 2 is a circuit diagram of a bit line multiplexer of the non-volatile memory circuit of FIG. 1, according to one embodiment of the present invention.

FIG. 2 is a circuit diagram that shows a portion of BLMUX 44 which receives signals BL0Sel-BLNSel and the corresponding complementary signals *BLSel0-*BLSelN. For each normal write operation, one of N+1 bit lines in each of the K+1 groups is selected. Therefore, for each write operation, one of BLSel0-BLSelN is asserted to the high voltage state by BL decoder 48 based on a portion of the received access address from controller 20. BLMUX 44 includes a K+1 number of bit line multiplexer circuits (80,81) for coupling one of a set of N+1 bit lines (e.g. BL00-BLN0) to a corresponding bit data line (e.g. BDL0) during a normal write operation. In the embodiment shown, each multiplexer circuit (e.g. 80) includes 2*(N+1) mux transistors. The mux transistors of each multiplexer circuit (e.g. 80) include a coupling transistor (e.g. 82, 84) for each bit line (BL00, BLN0, respectively) for coupling the selected bit line to the bit data line (BDL0) during a memory write operation. Each multiplexer circuit (e.g. 80) also includes a deselect transistor (e.g. 83, 85) for each bit line (BL00, BLN0, respectively) for coupling an unselected bit line to a Vcol_unsel node to receive an unselected column voltage (e.g. VSS) during a memory write operation. Multiplexer circuit 81 includes coupling transistors 92 and 94 and deselect transistors 93 and 95.

The gates (control electrodes of a FET) of the coupling transistors (82, 84, 92, and 94) are controlled by signals (BLSel0-BLSelN). One of the signals is asserted to couple the selected set of K+1 bit lines to the K+1 bit data lines (BDL0-BDLK) with one bit line for each multiplexer circuit (80, 81) being coupled to the respective bit data line (BDL0, BDLK) during the normal write operation. The gates of deselect transistors (83, 85, 93, and 95) are controlled by the complementary signals (*BLSel0-*BLSelN). Each complementary signal (of *BLSel0-*BLSelN) corresponding to unselected bit lines can be asserted to a logic level high (e.g. VDIO) to couple the unselected bit lines to Vcol_unsel during the normal write operation. During the normal write operation of write data D0-DK, for each multiplexer circuit (80, 81), N bit lines would be unselected and would be coupled to Vcol_unsel.

Figure 3:
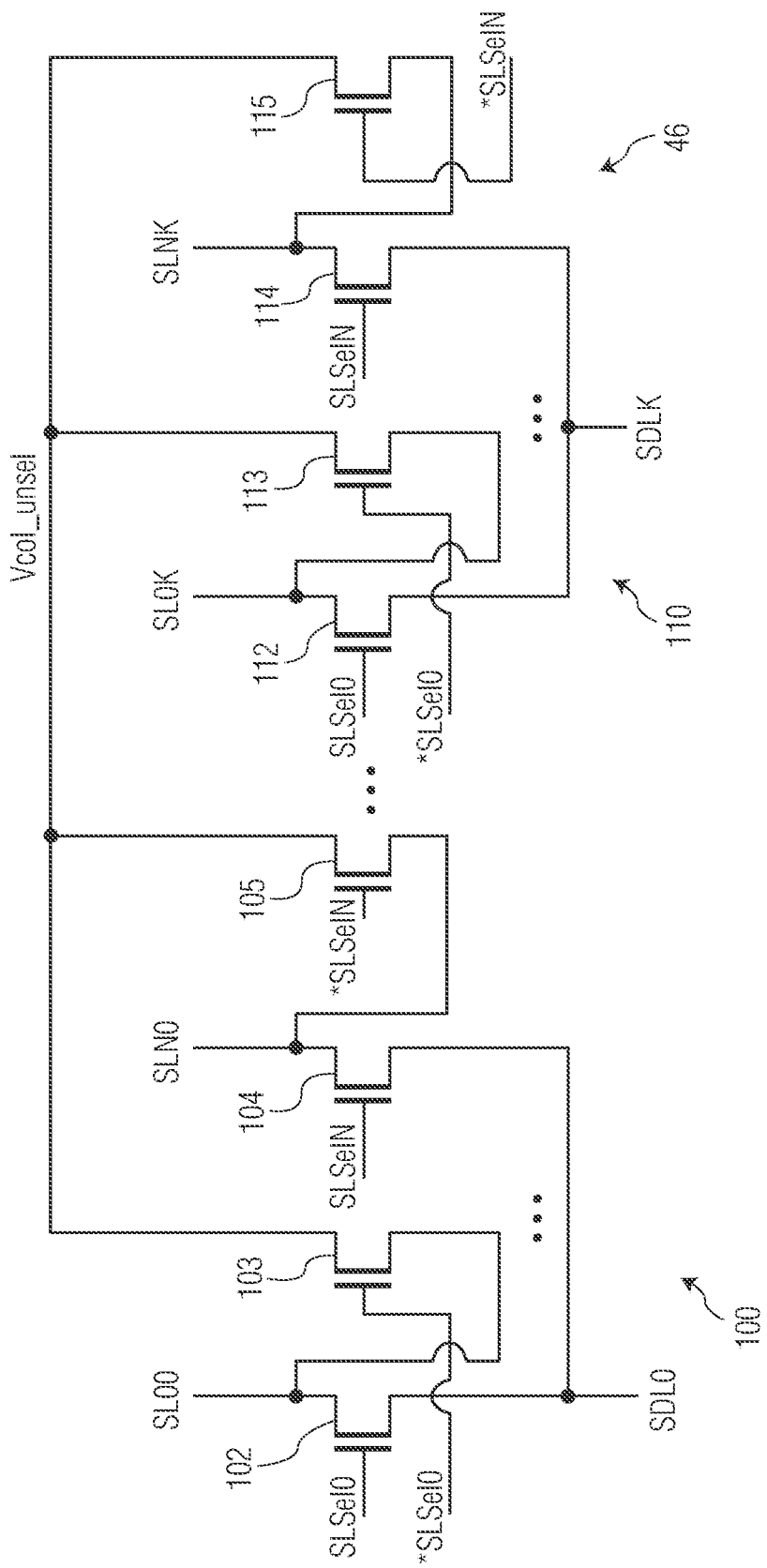
FIG. 3 is a circuit diagram of a source line multiplexer of the non-volatile memory circuit of FIG. 1, according to one embodiment of the present invention.

FIG. 3 is a circuit diagram that shows a portion of SLMUX 46 which receives signals SLSel0-SLSelN and the corresponding complementary signals *SLSel0-*SLSelN. For each normal write operation, one of N+1 bit lines in each of the K+1 groups is selected. Therefore, for each normal write operation, one of SLSel0-SLSelN is asserted to the high voltage state by SL decoder 50 based on a portion of the received access address from controller 20. SLMUX 46 includes K+1 number of source line multiplexer circuits (100,110) for coupling one of a set of N source lines (e.g. SL00-SLN0 or SL0K-SLNK) to a corresponding source data line (e.g. SDL0 or SDLK) during a write operation. In the embodiment shown, each multiplexer circuit (e.g. 100) includes 2*(N+1) mux transistors. The mux transistors of each multiplexer circuit (e.g. 100) include a coupling transistor (e.g. 102, 104) for each source line (e.g. SL00, SLN0, respectively) for coupling the selected source line to the source data line (SDL0) during a memory operation. Each multiplexer circuit (e.g. 100) also includes a deselect transistor (e.g. 103, 105) for each source line (e.g. SL00, SLN0, respectively) for coupling an unselected source line to the Vcol_unsel node to receive the unselected column voltage (e.g. VSS) during a memory operation. Multiplexer circuit 110 includes coupling transistors 112 and 114 and deselect transistors 113 and 115.

The gates (control electrodes of a FET) of the coupling transistors (102, 104, 112, and 114) are controlled by signals (SLSel0-SLSelN). One of the control signals is asserted to couple the selected set of K+1 source lines to the corresponding K+1 source data lines (SDL0-SDLK) with one source line for each multiplexer circuit (100, 110) being coupled to the respective source data line (SDL0, SDLK) during the normal write operation. The gates of deselect transistors (103, 105, 113, and 115) are controlled by complementary control signals (*SLSel0-*SLSelN). Each complementary control signal (of *SLSel0-*SLSelN) corresponding to unselected source lines can be asserted to a logic level high (e.g. VDIO) to couple the unselected source lines to Vcol_unsel during the normal write operation. During the memory write operation, for each multiplexer circuit (100, 110), N bit lines would be unselected and would be coupled to Vcol_unsel.

Operation of memory 10 (including BLMUX of FIG. 2 and SLMUX of FIG. 3) has been described above in reference to a normal write operation. In the case of a hidden write operation, it may be desirable to perform a write of only one bit at a time, which helps minimize circuit area. Therefore, in one embodiment, a smaller resistive memory array with only a single I/O port is used for these hidden writes. For example, in the descriptions which follow for hidden writes, it will be assumed that array 12 is implemented as a smaller array, including only portion 70. In this embodiment, memory 10 includes only a single I/O port, i.e. BDL0/SDL0. In this embodiment, K is 0 such that only one of N+1 bit line/source line pair is selected for each hidden write. Also, in this embodiment, only multiplexer circuit 80 is needed in BLMUX 44, and only multiplexer circuit 100 is needed in SLMUX 46. Similarly, only bit line driver 0 52, source line driver 0 54, and protection circuit 0 64 are needed in this embodiment (and may simply be referred to as bit line driver 52, source line driver 54, and protection circuit 64, respectively).

In the case of a single I/O port, since the write value is known for the SET or RESET commands, the write data need not be explicitly provided. In this case, control signals from the SET and RESET commands themselves can be used to control the bit line and source line drivers, as will be shown in the example of FIG. 4 below. For example, in response to the SET command, the control signal SET is asserted to a logic level high and its complement, SET_b, is negated to a logic level low. Similarly, in response to the RESET command, a control signal RESET is asserted to a logic level high and its complement, RESET_b, negated to a logic level low. Note that SET and RESET cannot both be asserted at the same time, such that when SET is asserted, RESET is not asserted, and vice versa.

During a hidden write operation to portion 70 of memory 10, a single bit line is selected and coupled to bit line driver 52 and a single source line is selected and coupled to bit line driver 54 of write circuitry 60. For the hidden write, similar to the normal write, write data may or may not be explicitly provided to the bit line driver and source line driver. However, unlike for normal writes, for any hidden write, the switch of isolation circuit 21 is open such that VC is isolated from VDIO and is used to provide the write current.

Referring to the illustrated embodiment of FIG. 1, bit line decoder 48 receives a regulated voltage Vy from voltage regulator 18, in which voltage regulator 18 is coupled to VC. Source line decoder 50 receives a bias voltage, Vbias_cascode. For a hidden write, bit line decoder 48 selects one bit line and source line decoder 50 selects one source line. For example, bit line decoder 48 selects a bit line in response to a SET command by asserting one of BLSel0-BLSelN, and provides regulated voltage Vy as the high state voltage for the asserted one of BLSel0-BLSelN. Similarly, source line decoder 50 provides Vbias_cascode as the high state voltage on the asserted (e.g. selected) one of SLSel0-SLSelN. (The low state voltage provided for the complement of the asserted bit line select signal and for the complement of the asserted source line select signal may be VSS.) The asserted bit line select signal during a hidden write is provided to a coupling transistor of MUX circuit 80 in BLMUX 44. Since these coupling transistors are NMOS transistors (i.e. n-channel transistors), upon application of the analog voltage Vy during the hidden write, the NMOS transistor corresponding to the selected bit line operates as a source follower. Note that the coupling transistors controlled by signals (SLSel0-SLSelN) are also NMOS transistors. In this manner, these transistors can also behave as source followers, such as during a RESET operation, which will be described further below as well. Note also that in the case of a normal (non-hidden) write, in which VC may be supplied as a regulated bit line or source line voltage and the asserted select signals may simply be set to a logic level high, the coupling transistors of BLMUX 44 (or SLMUX 46) will not operate as source followers, but as digital switches.

Figure 4:
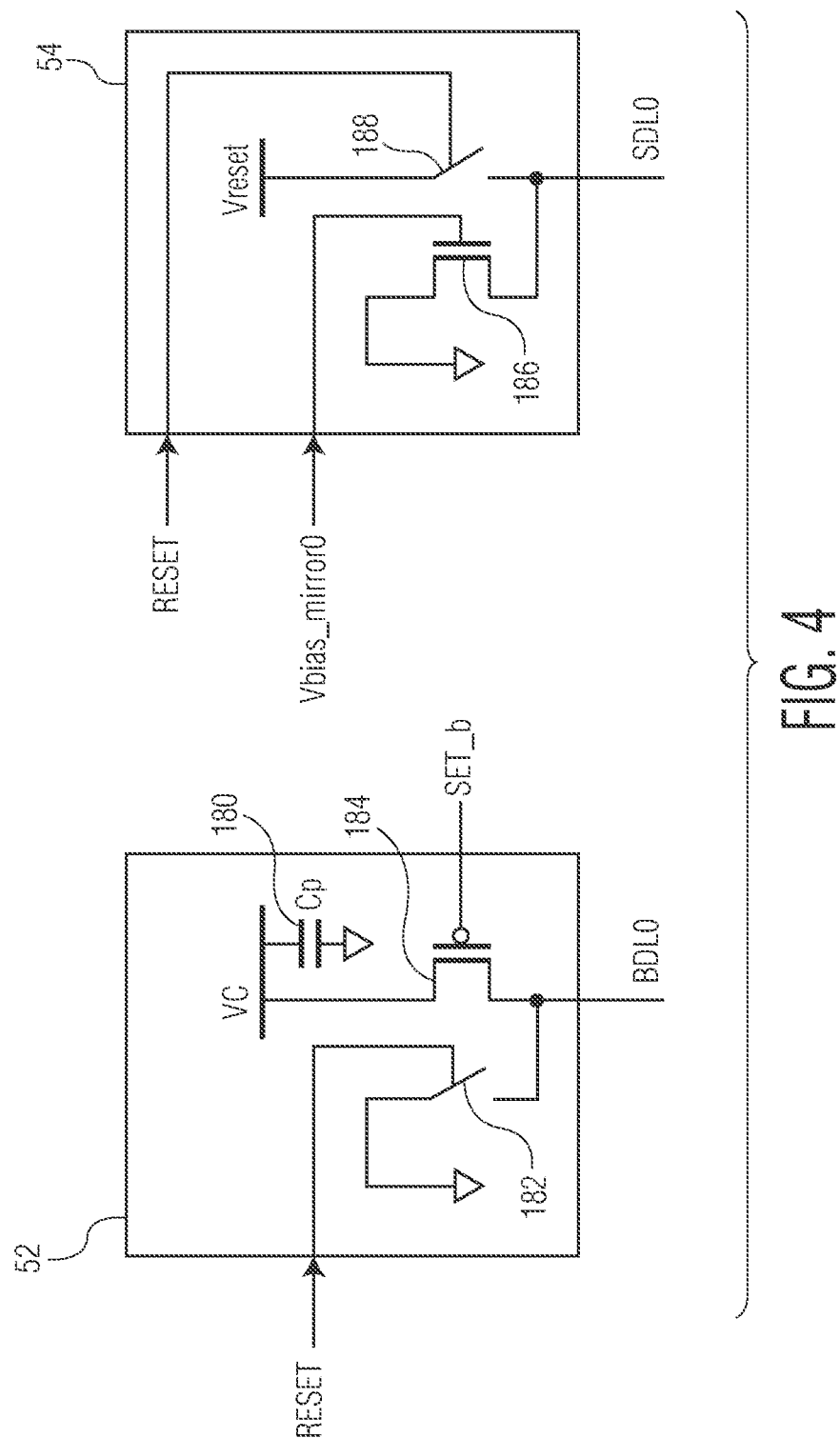
FIG. 4 is a circuit diagram of write driver circuits of the non-volatile memory circuit of FIG. 1, according to one embodiment of the present invention.

FIG. 4 is a circuit diagram of bit line driver circuit 52 and source line driver circuit 54, which may be used for performing write operations for the SET command or for the RESET command. Driver circuit 52 includes a grounding switch 182 (controlled by the control signal RESET) for coupling the bit data line (BDL0) to ground and a switch 184 (implemented as a PMOS transistor and controlled be SET_b) for coupling bit data line (BDL0) to VC. Bit line driver circuit 52 also includes a pre-charge capacitor (Cp) 180 having a first terminal coupled to VC and a second terminal coupled to VSS. In response to the SET command, the control signal SET is asserted to a logic level one and SET_b is negated to a logic level zero which results in switch 182 being open and switch 184 being closed (i.e. conductive) such that BDL0 is coupled to internal voltage VC. In response to the RESET command, the control signal RESET is asserted to a logic level high and SET is at a logic level low which results in switch 182 being closed (i.e. conductive), coupling BDL0 to VSS, and switch 184 being open (i.e. non-conductive).

Source line driver circuit 54 includes a grounding switch 186 (implemented as an NMOS transistor and controlled by an analog voltage, Vbias_mirror0) for coupling the source data line (SDL0) to ground, and a switch 188 (controlled by the control signal RESET) for coupling source data line (SDL0) to a reset voltage, Vreset. Therefore, in response to a SET command, switch 186 is made conductive by Vbias_mirror0, coupling SDL0 to VSS, and the control signal RESET is zero, opening switch 188. In response to the RESET command (in which a logic level zero is written to a selected memory cell), the control signal RESET is one in which switch 188 is closed (i.e. conductive), coupling SDL0 to Vreset, and switch 186 is open (i.e. non-conductive). In an alternate embodiment, the received write data and complementary write data (D0 and *D0) can be used with or instead of the SET and RESET control signals to control the switches within drivers 52 and 54. For a SET command, controller 20 provides D0 as 1 and for a RESET command, controller 20 provides D0 as 0.

In one embodiment of the bit line and source line drivers, switches 182 and 188 may be implemented as NMOS transistors, with the control signal RESET coupled to the control electrodes of the transistors. Note that in the illustrated embodiment of FIG. 1, both BLMUX 44 and SLMUX 46 (along with the bit line drivers and source line drivers) are located at the bottom of array 12, such that the bottom end of the source lines and bit lines are coupled via the corresponding MUX to corresponding drivers. However, different embodiments may use different physical placements. For example, BLMUX 44 and SLMUX 46 may be located on opposite sides of array 12. In this example, BLMUX 44 may be located at the top of array 12 such that the top end of each bit line is coupled via BLMUX 44 to a corresponding bit line driver, while SLMUX 46 is located at the bottom of array 12 such that the bottom end of each source line is coupled via SLMUX 46 to a corresponding source line driver. Also, alternate embodiments can use different placements for the circuit elements within the driver circuits. For example, pull-down switches or transistors, such as switches 182 and 186, can be physically placed at the bottom of array 12, while pull-up switches or transistors, such as 184 and 188, can be placed at the top of array 12. In the examples provided below with respect to FIGS. 5-7 and portion 70 of memory 10, it is assumed that BLMUX 44, as well as pull-up switch 184 of bit line driver 52, are located at the top of array 12, opposite SLMUX 46 and pull-down switch 186 of source line driver 54 which are located at the bottom of array 12. However, different embodiments can use a variety of different physical placements.

Figure 5:
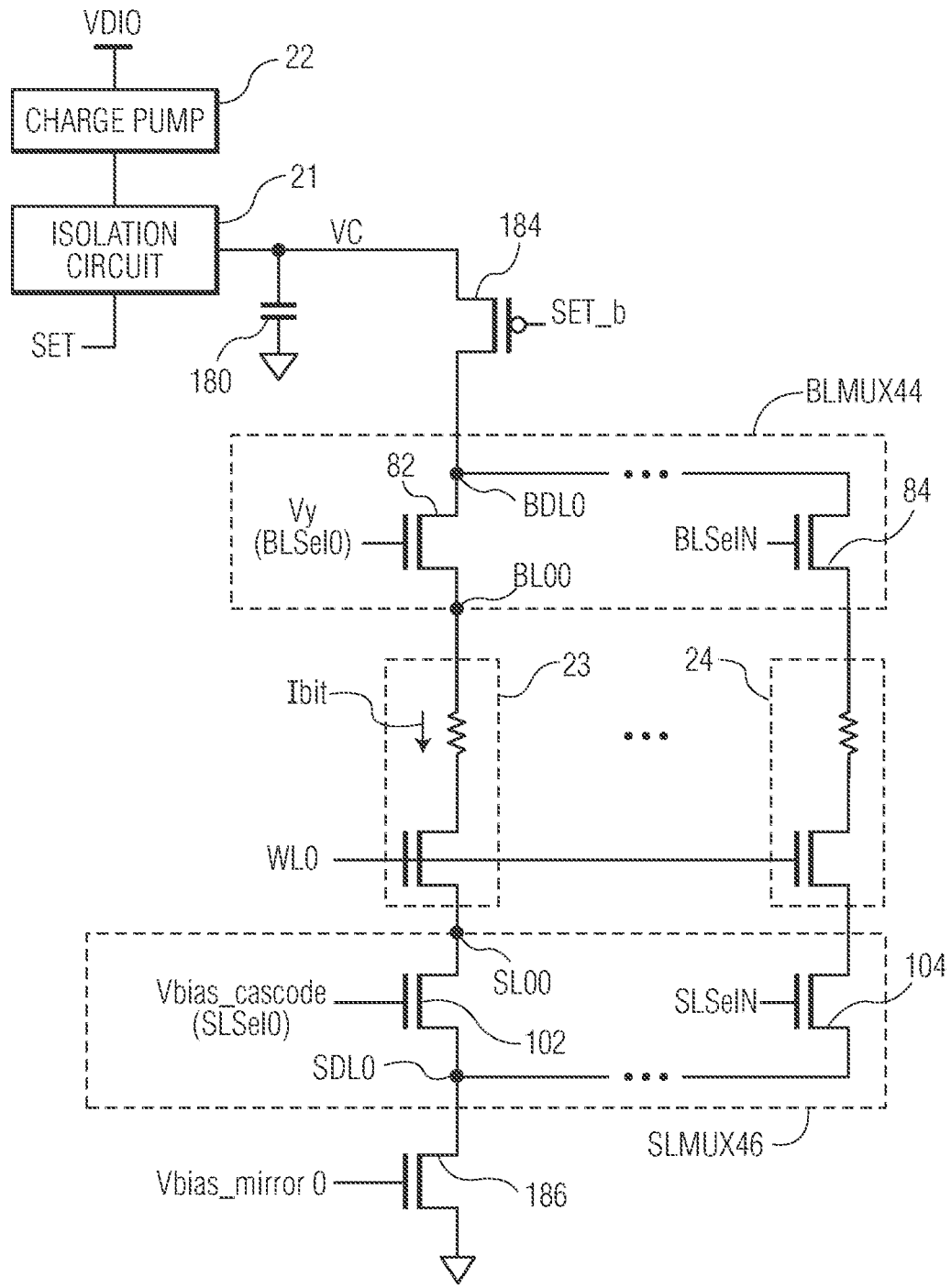
FIG. 5 is a circuit diagram showing a portion of the non-volatile memory circuit of FIG. 1 during a write operation to a selected bit according to one embodiment of the present invention.

FIG. 5 is a circuit diagram showing a portion of memory 10 during a hidden write operation in response to the SET command, in accordance with one embodiment of the present invention. For the example of FIG. 5, it is assumed that memory cell 23 (i.e. bit cell 23) in portion 70 is selected by the corresponding access address of the received SET command. Therefore, bit line MUX circuit 80 of BLMUX 44 and bit line driver circuit 52 as well as source line MUX circuit 100 of SLMUX 46 and source line driver circuit 54 are used for this hidden write operation. Row decoder 14 selects WL0 (i.e. activates WL0 by driving WL0 to a word line voltage which turns on the select transistor of memory cell 23). BL decoder 48 selects BLSel0 (and thus does not select BLSel1-BLSelN), and SL decoder 50 selects SLSel0 (and thus does not select SLSel1-SLSelN). Therefore, each of BL decoder 48 and SL decoder 50 provides a one-hot signal on the corresponding select lines for the corresponding column (column 0 in this example). As illustrated in FIG. 5, since BLSel0 is selected, BL decoder 48 provides Vy as the high voltage state to the control electrode of coupling transistor 82 (of MUX circuit 80 within BLMUX 44). Similarly, since SLSel0 is selected, SL decoder 50 provides Vbias_cascode as the high voltage state to the control electrode of coupling transistor 102 (of MUX circuit 100 within SLMUX 46). BLSel1-BLSelN and SLSel1-SLSelN can be provided as VSS to the control electrodes of the remaining unselected coupling transistors of MUX circuit 80 (e.g. coupling transistor 84) and of the remaining unselected coupling transistor of MUX circuit 100 (e.g. coupling transistor 104).

In the time prior to the hidden write operation, with SET at a logic level zero, the switch of isolation circuit is closed such that pre-charge capacitor Cp 180 of bit line driver circuit 52 is pre-charged to VC. Therefore, at the time of the hidden write operation, it is expected that Cp 180 has sufficient charge for providing an adequate write current. In one embodiment, charge pump 22 may be required to sufficiently pre-charge Cp 180 (for example, if VC needs to be greater than VDIO). However, in alternate embodiments, Cp 180 can be precharged by just VDIO without the need for a charge pump. Alternatively, a current limiter may be present instead of the charge pump. During the hidden write operation in response to the SET command, the switch of isolation circuit 21 is opened to isolate VC from VDIO, and VC is used as the power source to generate the write current. With VC isolated, the write current profile is hidden from VDIO during the hidden write. Note that Cp is sized such that the pre-charged voltage level VC can maintain the required voltage headroom for the write path during ramp down of VC to supply the write current and maintain the required bit line voltage (VBL) on the selected bit line BL00.

As seen in FIG. 5, SET_b turns on switch 184 in bit line driver 52, Vy turns on coupling transistor 82 in BLMUX 44, WL0 turns on the select transistor in bit cell 23, Vbias_cascode turns on coupling transistor 102 in SLMUX 46, and Vbias_mirror0 from protection circuit 64 turns on pull-down transistor 186 of source line driver 54. With VC from Cp 180 as the voltage supply, a write current, Ibit, is generated through bit cell 23 which programs bit cell 23 to the LRS, corresponding to programming the bit cell to a logic level one.

In the illustrated embodiment of FIG. 1, VC can be used as the voltage supply for voltage regulator 18 which generates Vy. The voltage level of Vy can be decided based on minimum VBL requirements for a bit cell of array 12 at the start of a SET operation. With Vy provided as the selected bit line select signal (BLSel0) at the gate electrode of NMOS transistor 82, transistor 82 operates as a source follower. In this manner, the required VBL on BL00 (the source of transistor 82) is maintained, despite VC (and the voltage on BDL0) quickly ramping down during the hidden write operation. By using transistor 82 as both the source follower and as part of BLMUX 44, increased design efficiency may also be achieved.

As illustrated in FIG. 1, each source line driver (source line driver 0-source line driver K) has a corresponding protection circuit (protection circuit 0 64-protection circuit K 66) coupled to the corresponding source data line (SDL0-SDLK) and coupled to provide a corresponding bias voltage, Vbias_mirror0-Vbias_mirrorK, to the source line driver. Each protection circuit protects the selected bit cell (e.g. bit cell 23) by limiting the write current and terminating the write current so as not over-write the selected bit cell. The use of the protection circuits for hidden writes may help further reduce the current profile during a security attack. In the example of FIG. 5 for a hidden write to bit cell 23 in portion 70, Vbias_mirror0 is provided to the gate electrode of pull-down transistor 186 in source line driver 54. Further details of Vbias_mirror0 and Vbias_cascode are provided in FIG. 6.

Figure 6:
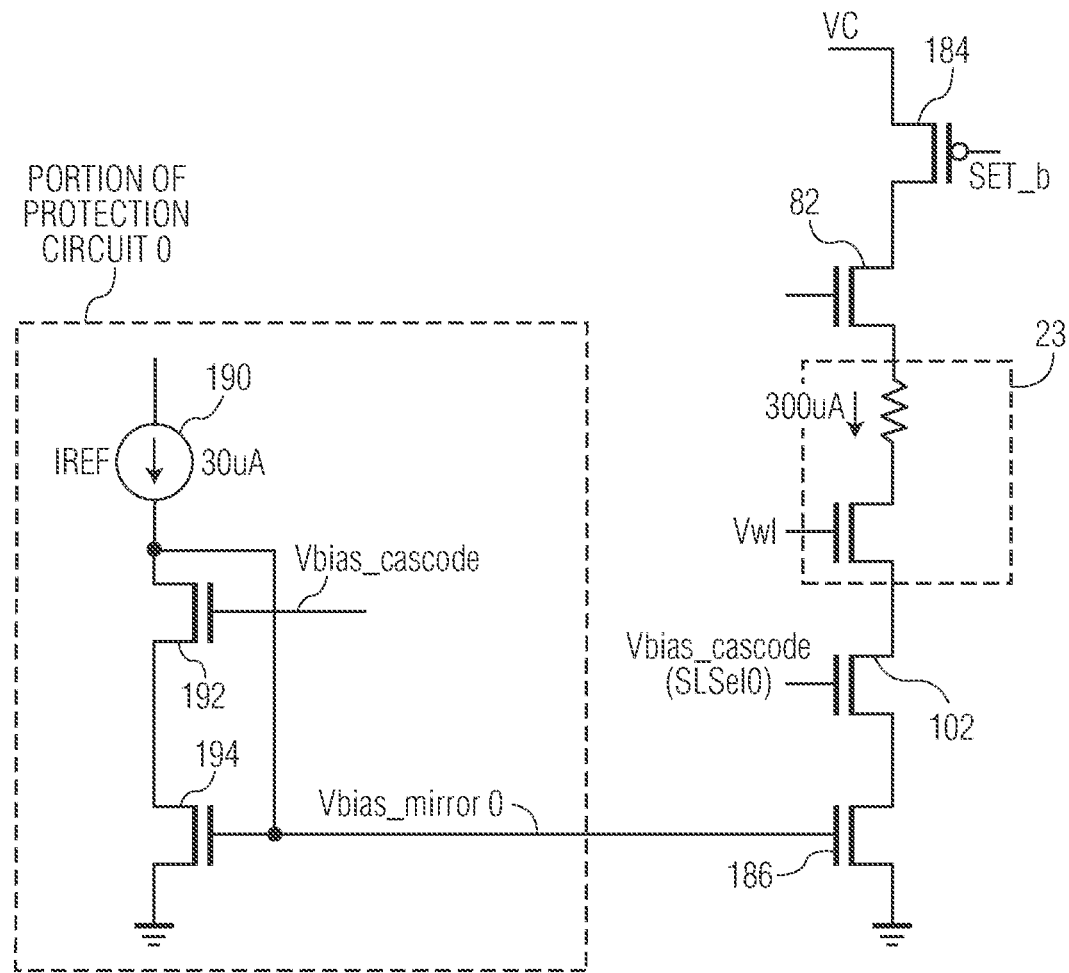
FIG. 6 is a circuit diagram showing a portion of the non-volatile memory circuit of FIG. 1 with a portion of a protection circuit according to one embodiment of the present invention.

FIG. 6 illustrates a circuit diagram of the portion of memory 10 of FIG. 5 along with a portion of protection circuit 64, which corresponds to SDL0 and source line driver 54. As seen in FIG. 6, transistor 186 in source line driver 54 is used as part of a current mirror with a transistor 194 of protection circuit 64 to limit the bit cell current to a maximum value. Transistors 192 and 194 are coupled in series between a reference current source 190 and VSS. Reference current source 190 is coupled to a first current electrode of transistor 192 and a control electrode of transistor 194. The reference current IREF is provided to an input of the current mirror at a first current electrode of transistor 194 (via transistor 192), and to the control electrode of transistor 194. The control electrode of transistor 194 is coupled to the control electrode of transistor 186, which generates a voltage, Vbias_mirror0, which is provided to the control electrode of transistor 186 to control the current through transistor 186. A bias voltage, Vbias_cascode, is provided to a control electrode of transistor 192 and is also provided as SLSel0 to the control electrode of coupling transistor 102 of SLMUX 46.

Note that transistors 102 and 186 operate as part of a cascode current mirror which limits the current Ibit. This cascode approach maintains the headroom of the write path as well as the accuracy of protection circuit 64. In one embodiment, the voltage level of Vbias_cascode is set based on the size and threshold voltage of transistors 102 and 186 and can be supplied from outside of memory 10 as a reference voltage. Vbias_cascode only drives one of the coupling transistors of SLMUX 46 corresponding to the selected source line (SL00 in this example) in which coupling transistor 102 couples SL00 to SDL0. The value of IREF is set to appropriately limit Ibit. For example, if the maximum value for Ibit is 300 microamps (uA), IREF can be set to 30 uA, and transistors 194 and 186 can be sized so as to achieve a maximum current of ten times IREF. In this manner, Vbias_mirror0 limits Ibit in the write path (through transistors 102 and 186) to 300 uA.

Figure 7:
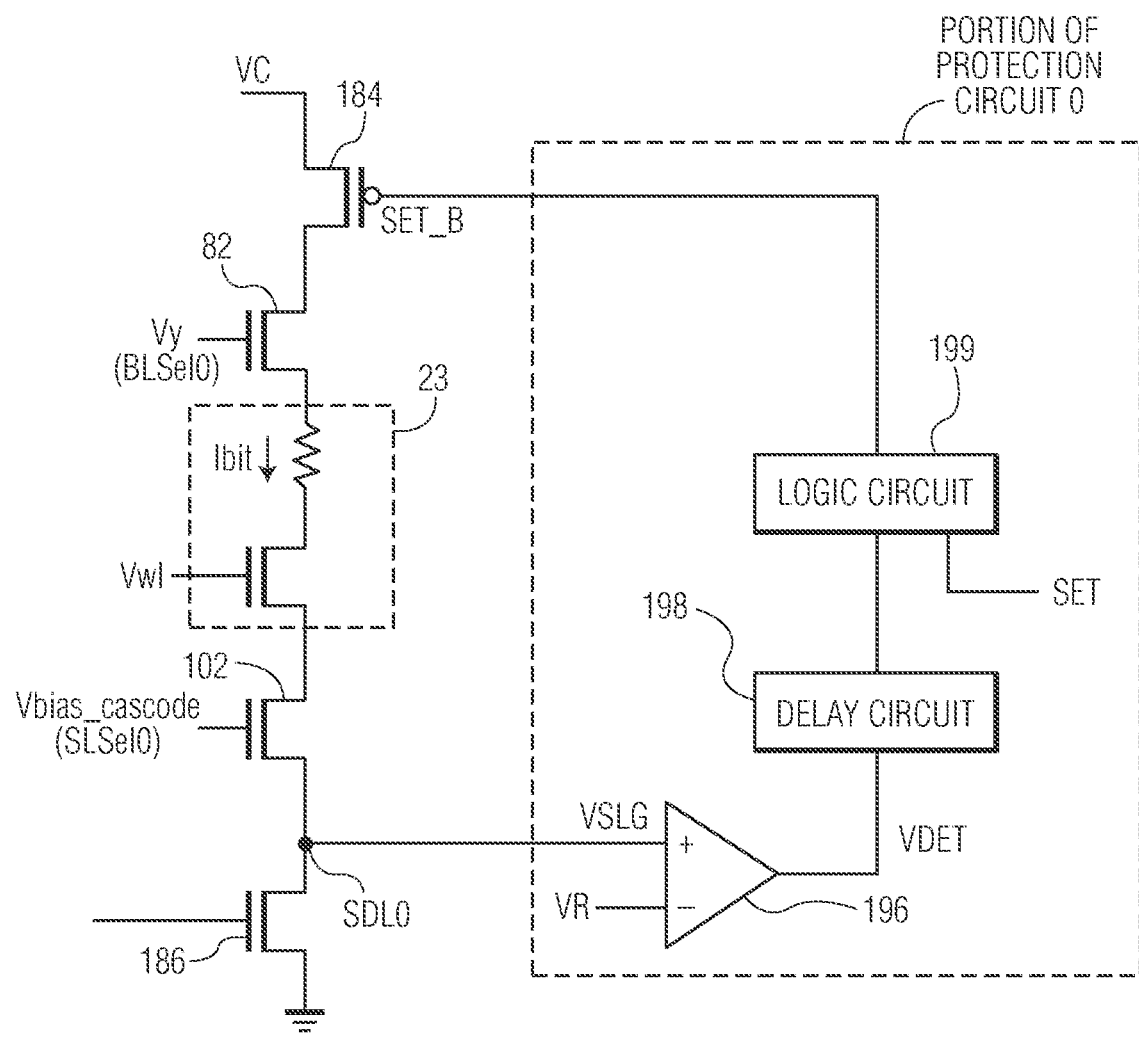
FIG. 7 is a circuit diagram showing a portion of the non-volatile memory circuit of FIG. 1 with another portion of the protection circuit according to one embodiment of the present invention.

FIG. 7 illustrates a circuit diagram of the portion of memory 10 of FIG. 5 along with another portion of protection circuit 64, which operates to limit a duration of the write current Ibit. Protection circuit 64 includes a comparator 196 having a first input (e.g. non-inverting input) coupled to SDL0 to detect the source line voltage, VSLG, at the drain of pull-down transistor 186 (corresponding to SDL0) and a second input coupled to receive a reference voltage VR. In one embodiment, comparator 196 may also be referred to as a source line voltage detector. Protection circuit 64 also includes a delay circuit 198 coupled to receive an output of comparator 196, VDET, which is asserted upon VSLG reaching VR. Protection circuit also includes a logic circuit 199 coupled to delay circuit 198 and to the control electrode of transistor 184. Logic circuit 199 receives the control signal SET and controls the value of SET_b. In this embodiment, note that SET_b is not always provided as the complement of SET, but its value is based on a combination of the control signal SET and a current program level of the selected bit cell.

In operation, during a hidden write (such as in response to the SET command), the protection circuit provides for write termination which can help reliability by preventing the overwriting of the selected bit cell. At the beginning of a hidden write in response to the SET command, SET is one, SET_b is zero, and the write current Ibit is generated through the selected bit cell (e.g. bit cell 23) as described in the example of FIG. 5. As Ibit is provided through the write path, comparator 196 detects when VSLG increases and reaches VR, in which VR can be set to the minimum voltage level at SDL0 corresponding to the maximum write current. Upon VSLG reaching VR, VDET is asserted to a logic level one. VDET is propagated through the delay circuit 198, whose delay may correspond to the maximum amount of time required to completely program the selected bit cell. Logic circuit 199, which can be implemented using any combination of combinational logic, provides SET_b as zero when the SET is a logic level one, and VDET is not yet asserted (while VSLG is still below VR). However, logic circuit 199 changes SET_b to a logic level one once VDET is asserted at the output of comparator 196 (due to VSLG reaching VR) and has propagated through delay circuit 198 to reach logic circuit 199. When SET_b is changed to a logic level one, the write path is turned off (by opening the switch in the bit line driver circuit, e.g. switch 184).

Figure 8:
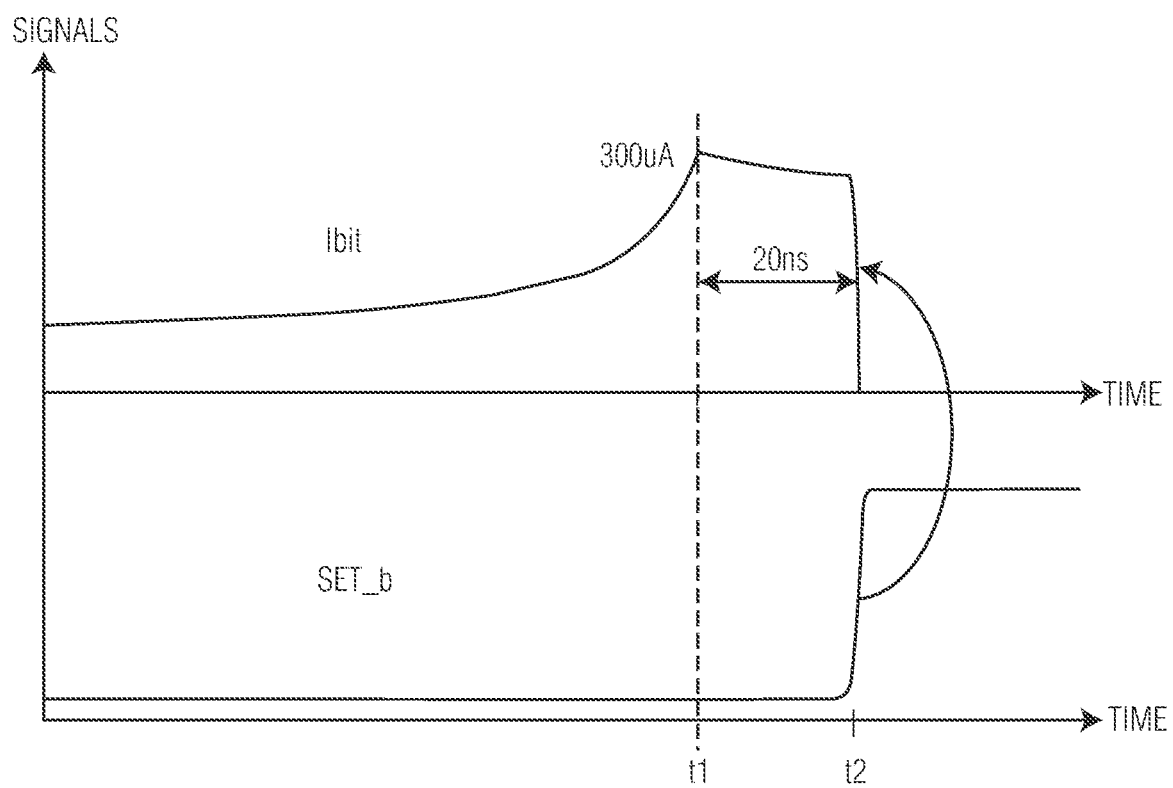
FIG. 8 is a waveform diagram showing a few of the signals of FIG. 7, in accordance with one example.

FIG. 8 provides example timing diagrams illustrating example values of Ibit and SET_b during operation of protection circuit 64 described in reference to FIGS. 6 and 7. Therefore, with the write path enabled in response to the SET command (with SET being a one and SET_b being a zero initially), the write current Ibit is generated through bit cell 23. As the write current flows through bit cell 23 to program the resistive element to a LRS, protection circuit 64 (as illustrated in FIG. 6) operates to limit the maximum current to 300 uA. Therefore, at time t1 Ibit is at its maximum value of 300 uA. When the voltage VSLG hits VR, VDET is asserted and propagated through delay circuit 198, which in one example, provides a 20 nanosecond (ns) delay. Therefore, at t2, 20 ns after t1, SET_b is changed to a logic level one by logic circuit 199 and the write path is disabled, which terminates the write current. Note that delay circuit 198 can also add additional delay, if needed for write performance. Note also that in alternate embodiment, the protection circuit, or one of the portions of the protection circuit described in FIGS. 6 and 7, may not be present.

In one embodiment, a RESET command, corresponding to programming the selected bit cell a logic level zero (e.g. to the HRS) can be performed by coupling the corresponding data bit line and the corresponding source data line to a reset voltage, Vreset, which is greater than VSS, such that current flows from the source line to the bit line through the resistive storage element in an opposite direction as for the SET command. Referring to the example of FIG. 5 in which bit cell 23 is the selected bit sell, switch 182 (which would be closed in response to RESET being a logic level one) couples VDL0 to VSS, and switch 188 (which would also be closed in response to RESET being a logic level one) couples SDL0 to Vreset. In this example, Ibit would flow in the opposite direction through bit cell 23 as compared to Ibit in FIG. 5. In the case in which the RESET command is performed as a normal write, the switch of isolation circuit 21 remains closed. In this case, the high voltage state of an asserted bit line select signal and asserted source line select signal can simply be provided as VDIO rather than as Vy and Vbias_cascode, respectively. However, in one embodiment, the RESET command may also be performed as a hidden write. In this embodiment, the switch in isolation circuit 21 would be opened as well, and a corresponding isolated pre-charge capacitor would provide Vreset (similar to how VC is provided for a hidden write). Also in this embodiment, the coupling transistor in SLMUX 46, such as transistor 102, would operate as a source follower to ensure the proper source line voltage is maintained as Vreset ramps down quickly.

The descriptions provided above in FIGS. 5-8 assumed that memory 10 only included a single I/O port, as with portion 70 of memory 10. In this manner, each hidden write to memory 10 would correspond to the write of a single bit at a time. However, hidden writes may similarly apply to each of the K+1 I/O ports of memory 10. For example, a hidden write in response to a SET command for any bit in array 12 would be performed in a similar way, in which each of the K+1 bit line drivers, source line driver, and protection circuits would include analogous circuitry as bit line driver 52, source line driver 54, and protection circuit 64. Also, in the case of having multiple I/Os, the value of the corresponding bit of write data (of D0-DK), along with the SET and RESET control signals, may be used by the bit line drivers and source line drivers for the hidden writes to control the switches in the drivers as needed to properly bias the bit data lines and source data lines. In one embodiment, to implement these hidden writes, each bit line driver may include its own corresponding pre-charge capacitor Cp, in which the multiple Cp capacitors would be connected in parallel to VC, in which the VC node is common to multiple bit line drivers. In this embodiment, all the pre-charge capacitors would be precharged so as to be ready for a hidden write, and a single charge pump and a single isolation circuit may be shared such that in response to a SET operation on any of the K+1 I/Os would result in opening the switch of isolation circuit 21. Alternatively, a pre-charge capacitor may be shared between two or more I/Os of the memory, but in this case, a larger Cp may be needed.

In one embodiment, hidden writes are performed only one bit at a time, regardless of the size of array 12. For example, single bits can be written in series, one column at a time. However, as is the case with normal writes described above, multiple bits in parallel may also be supported. In the case of hidden writes to multiple bits in parallel, though, one or more larger pre-charge capacitors may be needed. Therefore, there is a tradeoff between the number of parallel bits supported for hidden writes vs the amount of area required to provide the one or more pre-charge capacitors. Note also that the bit line driver circuits and source line driver circuits may include more elements, as needed, to handle normal writes as well as the hidden writes in order to ensure that the correct write current flows in the desired direction through the one or more selected bit cells. However, since it is not necessary to hide the current profile from externally visible I/O pads during normal writes, an internal voltage source and the isolation of that internal source is not needed for the normal writes.

By now it can be appreciated that a hidden write can be performed by supplying a bit cell write current with an internal voltage supplied by a pre-charged capacitor. The internal voltage supply is isolated from the I/O pads during the hidden write in order to hide the current profile of the write current. In this manner, the memory may be better protected from side-channel attacks since activity during the hidden write is not reflected in any of the I/O pads of the memory or SoC. Since the write current for a hidden write is provided by the pre-charged capacitor, a coupling transistor of a corresponding column MUX can be operated as a source follower during the hidden write in order to ensure that the appropriate bit line voltage is maintained, even as the internal supply voltage quickly ramps down. In one embodiment, hidden writes are used to write secure data.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Some of the above embodiments, as applicable, may be implemented using a variety of different memory architectures. For example, although FIG. 1 and the discussion thereof describe an exemplary memory architecture, this exemplary architecture is presented merely to provide a useful reference in discussing various aspects of the invention. Of course, the description of the memory has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

Although the invention is described herein with reference to specific embodiments, various modifications and changes can be made without departing from the scope of the present invention as set forth in the claims below. For example, different layouts for a resistive memory or for portions of the resistive memory, such as for the resistive memory cell, may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The following are various embodiments of the present invention.

In an embodiment, an integrated circuit (IC) device includes an input/output (I/O) pad configured to conduct voltage from a supply voltage; and a memory circuit, in which the memory circuit includes an array of non-volatile memory (NVM) cells including rows and columns of memory cells, a particular memory cell is accessed using a word line of a selected row, and a bit line and a source line of a selected column; an internal supply voltage with a current profile that is not measurable outside the integrated circuit device or the memory circuit; and an isolation circuit controlled by a write type indicator, wherein, when the write type indicator indicates a hidden write operation, the isolation circuit isolates the internal supply voltage from the supply voltage, and the internal supply voltage is selected by the isolation circuit to perform the hidden write operation along a bit line in a selected column of the array of NVM cells. In one aspect, the IC further includes a charge pump coupled between the supply voltage and the isolation circuit, wherein when the write type indicator indicates a write operation that is not hidden, voltage from the charge pump is selected by the isolation circuit to perform the write operation that is not hidden. In a further aspect, the IC device includes a capacitor configured to provide the internal supply voltage, wherein the capacitor is pre-charged using the supply voltage when the hidden write operation is not being performed. In another aspect, the array of NVM cells includes resistive memory cells. In another aspect, the hidden write operation is used to write secure data. In a further aspect, the IC device further includes a voltage control source follower circuit coupled to each of the memory cells. In a further aspect, the IC device further includes a supply voltage terminal coupled to output of the isolation circuit; and a voltage regulator including an input coupled to the supply voltage terminal and an output that provides a bit line select voltage, wherein the voltage control source follower circuit is implemented using an NMOS transistor including a first current electrode coupled to the supply voltage terminal, a second current electrode coupled to a corresponding one of the memory cells, and a gate electrode coupled to the bit line select voltage. In a further aspect, the IC device further includes a coupling switch configured to couple the supply voltage terminal to the voltage source follower circuit when the write type indicator indicates a hidden write is to be performed. In another aspect, the IC device further includes source line driver circuits; and protection circuits, each of the protection circuits are coupled to a respective one of the source line driver circuits, wherein a portion of the respective one of the source line driver circuits is used as part of a cascode current mirror in the protection circuit. In another further aspect, the IC device further includes source line driver circuits; and protection circuits, each of the protection circuits are coupled to a respective one of the source line driver circuits, and a portion of each of the protection circuits includes a source line voltage detector, a delay circuit coupled to output of the source line voltage detector, and a logic circuit coupled to output of the delay circuit, and output of the logic circuit is coupled to the gate electrode of the coupling switch. In yet another aspect, the IC device further includes the supply voltage, wherein the supply voltage is accessible outside the integrated circuit device.

In another embodiment, a method includes in an integrated circuit that includes an array of non-volatile memory cells with resistive storage elements, protecting data being written to at least one memory cell by: using a power source internal to the integrated circuit to write to at least one memory cell in the memory array during a first type of write operation, wherein current levels at the power source cannot be monitored external to the integrated circuit; and using a supply voltage provided at an input/output pin of the integrated circuit to write to at least one memory cell in the memory array during a second type of write operation. In one aspect, the method further includes charging a capacitor to a desired level during the second type of write operation; and discharging the capacitor to perform the first type of write operation. In a further aspect, the method further includes charging the capacitor using a charge pump; and decoupling the capacitor from the charge pump during the first type of write operation. In another aspect, the method further includes providing a bit line select voltage to a source follower circuit, wherein the source follower circuit includes a first current electrode coupled to a bit data line, a second current electrode coupled to the at least one memory cell, and a gate electrode coupled to the bit line select voltage.

In yet another embodiment, an IC device includes a non-volatile memory device which includes an array of non-volatile memory cells; and an isolation circuit configured to conduct voltage from an internal voltage supply to one of the memory cells during a hidden write operation to the one of the memory cells, and conduct voltage from an external voltage supply to the one of the memory cells during a non-hidden write operation to the one of the memory cells. In one aspect, the memory cells are arranged in rows and columns, and the IC device further includes a voltage regulator including an input coupled to the supply voltage terminal and an output that provides a bit line select voltage; bit lines, each of the bit lines selectively couplable to a respective column of the memory cells using the bit line select voltage; a supply voltage terminal coupled to output of the isolation circuit; and a voltage control source follower circuit including a first current electrode coupled to a bit data line, a second current electrode coupled to a corresponding one of the memory cells, and a gate electrode coupled to the bit line select voltage. In one aspect, current at the external voltage supply can be monitored external to the IC device during the non-hidden write operation, and current of the internal voltage supply is provided by a capacitor that cannot be monitored external to the IC device during the hidden write operation. In one aspect, the IC device further includes source line driver circuits; and protection circuits, each of the protection circuits are coupled to a respective one of the source line driver circuits, wherein a portion of the respective one of the source line driver circuits is used as part of a cascode current mirror in the protection circuit. In another aspect, the IC device further includes a supply voltage terminal coupled to output of the isolation circuit; and a coupling switch configured to couple the supply voltage terminal to the voltage source follower circuit when a write type indicator indicates a hidden write is to be performed, wherein the coupling switch is a PMOS transistor including a first current electrode coupled to the supply voltage terminal, a second current electrode coupled to the first current electrode of the voltage control source follower circuit, and a gate electrode, and a portion of the protection circuit includes a source line voltage detector, a delay circuit coupled to output of the source line voltage detector, and a logic circuit coupled to output of the delay circuit, and output of the logic circuit is coupled to the gate electrode of the coupling switch.

What is claimed is:

1. An integrated circuit (IC) device comprising:
   an input/output (I/O) pad configured to conduct voltage from a supply voltage; and
   a memory circuit including:
   an array of non-volatile memory (NVM) cells including rows and columns of memory cells, a particular memory cell is accessed using a word line of a selected row, and a bit line and a source line of a selected column;
   an internal supply voltage with a current profile that is not measurable outside the integrated circuit device or the memory circuit;
   an isolation circuit controlled by a write type indicator, wherein, when the write type indicator indicates a hidden write operation, the isolation circuit isolates the internal supply voltage from the supply voltage, and the internal supply voltage is selected by the isolation circuit to perform the hidden write operation along a bit line in a selected column of the array of NVM cells;
   source line driver circuits; and
   protection circuits, each of the protection circuits are coupled to a respective one of the source line driver circuits, wherein a portion of the respective one of the source line driver circuits is used as part of a cascode current mirror in the protection circuit.

2. The IC device of claim 1 further comprising:
   a charge pump coupled between the supply voltage and the isolation circuit, wherein when the write type indicator indicates a write operation that is not hidden, voltage from the charge pump is selected by the isolation circuit to perform the write operation that is not hidden.

3. The IC device of claim 2 further comprising:
   a capacitor configured to provide the internal supply voltage, wherein the capacitor is pre-charged using the supply voltage when the hidden write operation is not being performed.

4. The IC device of claim 2 further comprising:
   a voltage control source follower circuit coupled to each of the memory cells.

5. The IC device of claim 4 further comprising:
   a supply voltage terminal coupled to an output of the isolation circuit; and
   a voltage regulator including an input coupled to the supply voltage terminal and an output that provides a bit line select voltage, wherein the voltage control source follower circuit is implemented using an NMOS transistor including a first current electrode coupled to the supply voltage terminal, a second current electrode coupled to a corresponding one of the memory cells, and a gate electrode coupled to the bit line select voltage.

6. The IC device of claim 5 further comprising:
a coupling switch configured to couple the supply voltage terminal to the voltage source follower circuit when the write type indicator indicates a hidden write is to be performed.

7. The IC device of claim 1 wherein:
the array of NVM cells includes resistive memory cells.

8. The IC device of claim 1 wherein:
the hidden write operation is used to write secure data.

9. The IC device of claim 1 further comprising:
the supply voltage, wherein the supply voltage is accessible outside the integrated circuit device.

10. An integrated circuit (IC) device comprising:
an input/output (I/O) pad configured to conduct voltage from a supply voltage;
a memory circuit including:
an array of non-volatile memory (NVM) cells including rows and columns of memory cells, a particular memory cell is accessed using a word line of a selected row, and a bit line and a source line of a selected column;
an internal supply voltage with a current profile that is not measurable outside the integrated circuit device or the memory circuit;
an isolation circuit controlled by a write type indicator, wherein, when the write type indicator indicates a hidden write operation, the isolation circuit isolates the internal supply voltage from the supply voltage, and the internal supply voltage is selected by the isolation circuit to perform the hidden write operation along a bit line in a selected column of the array of NVM cells;
a voltage control source follower circuit coupled to each of the memory cells;
a coupling switch configured to couple the supply voltage terminal to the voltage source follower circuit when the write type indicator indicates a hidden write is to be performed;
source line driver circuits; and
protection circuits, each of the protection circuits are coupled to a respective one of the source line driver circuits, and a portion of each of the protection circuits includes a source line voltage detector, a delay circuit coupled to output of the source line voltage detector, and a logic circuit coupled to output of the delay circuit, and output of the logic circuit is coupled to the gate electrode of the coupling switch;
a supply voltage terminal coupled to an output of the isolation circuit; and
a voltage regulator including an input coupled to the supply voltage terminal and an output that provides a bit line select voltage, wherein the voltage control source follower circuit is implemented using an NMOS transistor including a first current electrode coupled to the supply voltage terminal, a second current electrode coupled to a corresponding one of the memory cells, and a gate electrode coupled to the bit line select voltage.

11. The IC device of claim 10 further comprising:
a charge pump coupled between the supply voltage and the isolation circuit, wherein when the write type indicator indicates a write operation that is not hidden, voltage from the charge pump is selected by the isolation circuit to perform the write operation that is not hidden.

12. The IC device of claim 10 further comprising:
a capacitor configured to provide the internal supply voltage, wherein the capacitor is pre-charged using the supply voltage when the hidden write operation is not being performed.

13. The IC device of claim 10 wherein:
the array of NVM cells includes resistive memory cells.

* * * * *